United States Patent
Hizume et al.

(10) Patent No.: US 10,873,714 B2
(45) Date of Patent: Dec. 22, 2020

(54) IMAGE SENSOR WITH MULTIPLE PIXEL ACCESS SETTINGS

(71) Applicant: SEMICONDUCTOR COMPONENTS INDUSTRIES, LLC, Phoenix, AZ (US)

(72) Inventors: Koji Hizume, Tokyo (JP); Mariko Hirano, Tokyo (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 108 days.

(21) Appl. No.: 16/155,932

(22) Filed: Oct. 10, 2018

(65) Prior Publication Data

US 2019/0141274 A1 May 9, 2019

Related U.S. Application Data

(60) Provisional application No. 62/583,981, filed on Nov. 9, 2017.

(51) Int. Cl.
| | |
|---|---|
| *H04N 5/374* | (2011.01) |
| *H04N 5/3745* | (2011.01) |
| *H01L 27/146* | (2006.01) |
| *H04N 5/341* | (2011.01) |
| *H04N 5/353* | (2011.01) |
| *H04N 5/345* | (2011.01) |
| *H04N 5/343* | (2011.01) |

(52) U.S. Cl.
CPC ..... *H04N 5/3745* (2013.01); *H01L 27/14603* (2013.01); *H01L 27/14609* (2013.01); *H04N 5/341* (2013.01); *H04N 5/343* (2013.01); *H04N 5/345* (2013.01); *H04N 5/3532* (2013.01)

(58) Field of Classification Search
CPC .................................................. H04N 5/3745
USPC ......................................................... 348/308
See application file for complete search history.

(56) References Cited

U.S. PATENT DOCUMENTS

| | | | |
|---|---|---|---|
| 6,507,365 B1 | 1/2003 | Nakamura et al. | |
| 6,515,702 B1 | 2/2003 | Yadid-Pecht et al. | |
| 6,900,837 B2 | 5/2005 | Muramatsu et al. | |
| 9,438,830 B2 | 9/2016 | Kim et al. | |
| 2010/0309340 A1 | 12/2010 | Border et al. | |
| 2011/0080500 A1 | 4/2011 | Wang et al. | |
| 2017/0195603 A1* | 7/2017 | Kawazu | H04N 5/347 |

FOREIGN PATENT DOCUMENTS

| | | |
|---|---|---|
| DE | 10218313 A1 | 11/2003 |
| DE | 102008052916 A1 | 4/2010 |
| DE | 102010051438 A1 | 5/2012 |
| EP | 2819397 B1 | 1/2016 |

(Continued)

*Primary Examiner* — Joel W Fosselman
(74) *Attorney, Agent, or Firm* — Treyz Law Group, P.C.; Tianyi He

(57) ABSTRACT

An image sensor may include an array of pixels arranged in rows and columns. Row control circuitry may be coupled to the array of pixels to reset, control charge transfer, and read out operations. Pixel access circuitry in processing circuitry may provide control signals to row control circuitry to access the array of pixels using multiple pixel access settings. In particular, by using multiple pixel access setting, the array of pixels may successively and efficiently generate image frames of different types.

19 Claims, 13 Drawing Sheets

(56) References Cited

FOREIGN PATENT DOCUMENTS

| EP | 1819151 | B1 | 5/2016 |
|----|---------|----|--------|
| WO | 2008075159 | A2 | 6/2008 |
| WO | 2010059182 | A1 | 5/2010 |
| WO | 2016187469 | A1 | 11/2016 |

\* cited by examiner

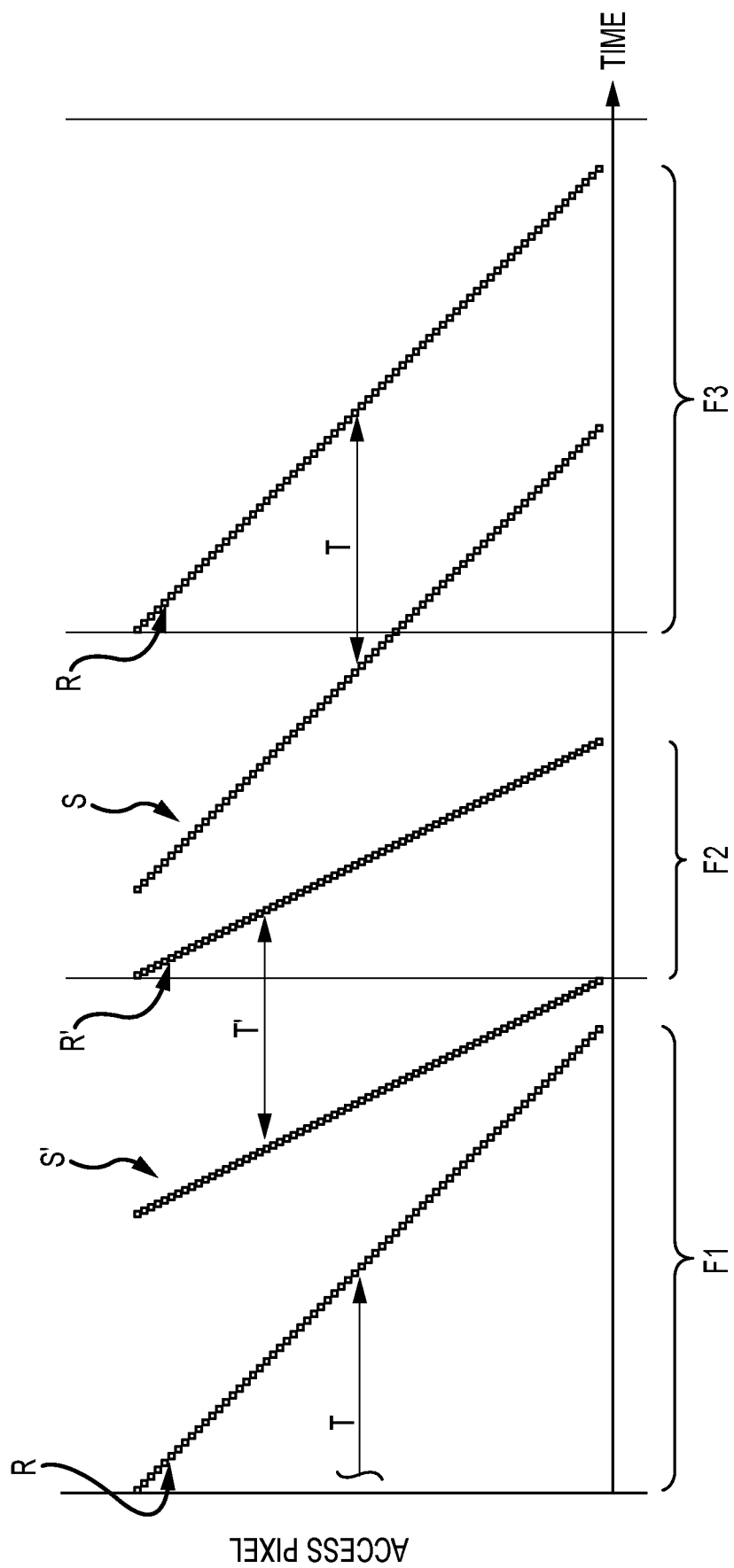

IMAGE SENSOR WITH MULTIPLE PIXEL ACCESS SETTINGS

This application claims benefit of and claims priority to provisional patent application No. 62/583,981, filed Nov. 9, 2017, which is hereby incorporated by reference herein in its entirety.

BACKGROUND

This relates generally to imaging devices, and more particularly, to pixel access schemes in imaging devices.

Image sensors are commonly used in electronic devices such as cellular telephones, cameras, and computers to captures images. In a typical arrangement, an image sensor is provided with an array of image pixels arranged in pixel rows and pixel columns. The image pixels contain a photodiode for generating charge in response to light (e.g., by photoelectric conversion). Circuitry is commonly coupled to each pixel column for reading out image signals from the image pixels. The image signals read out from the array of pixels are used to form image frames.

In general, the pixel array continually captures image frames with the same pixel access settings. However, this decrease the flexibility of the pixel array to capture intervening image frames of other types with other pixel access settings. There is a strong need for an image sensor configured to efficiently implement different pixel access settings for different image frames.

It would therefore be desirable to be able to provide imaging devices with improved pixel access schemes.

BRIEF DESCRIPTION OF THE DRAWINGS

FIG. 5 is a timing diagram for operating an image sensor to generate image frames of different types in accordance with some embodiments.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
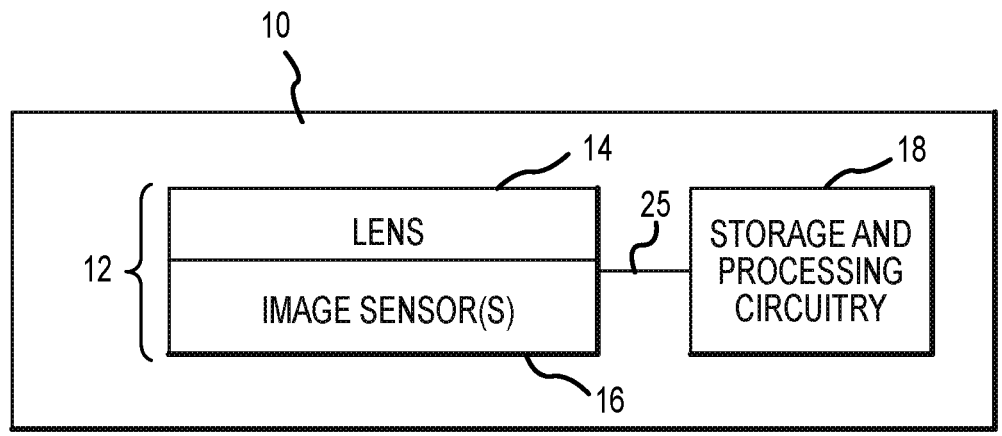
FIG. 1 is a diagram of an illustrative electronic device having an image sensor and processing circuitry for capturing image frames in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
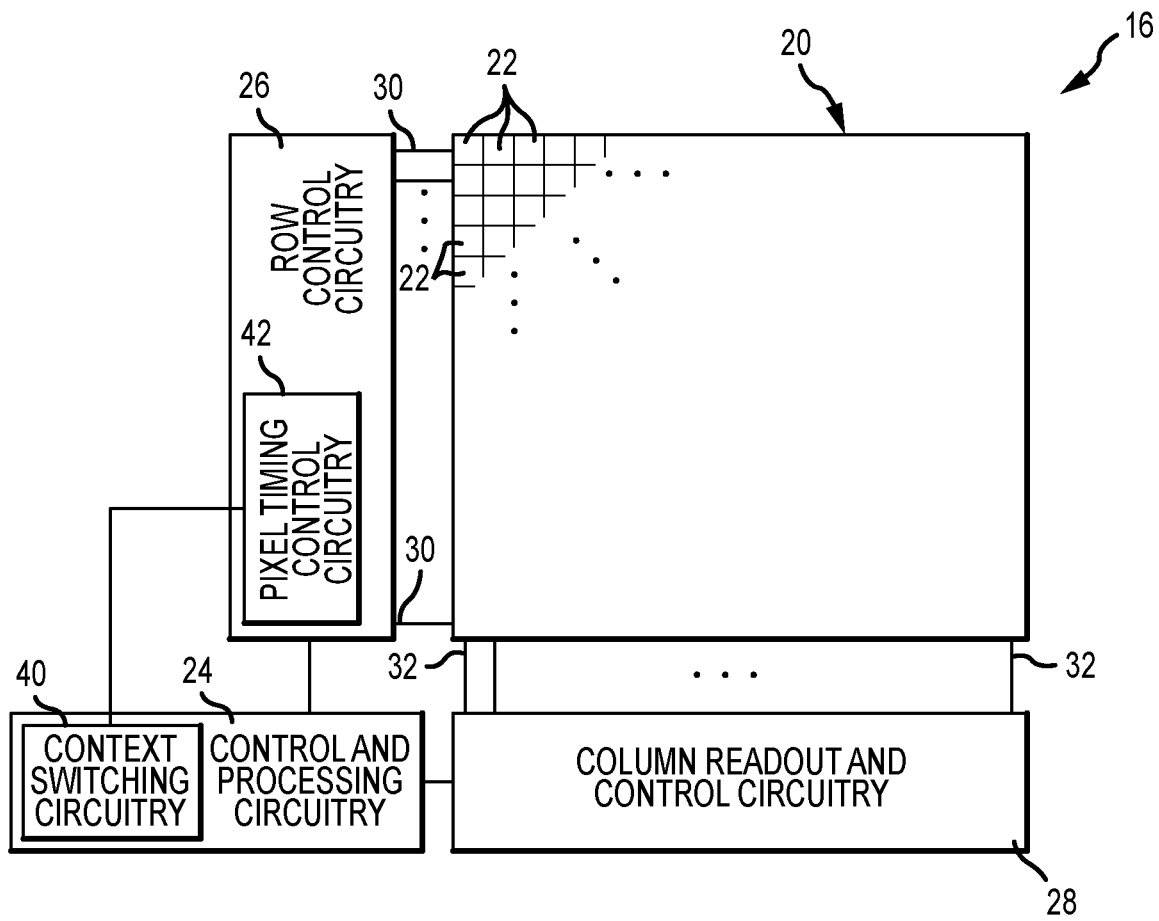
FIG. 2 is a diagram of an illustrative pixel array, associated readout circuitry, and pixel context switching circuitry for forming image frames of different types in accordance with some embodiments.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32. If desired, during pixel readout operations, one or multiple rows in array 20 may be selected using row control circuitry 26 and pixel control signals may be manipulated so as to operate the pixels in the selected row or rows in an operating mode as desired. Such operating mode may involve but may not be limited to, actively resetting the pixels in the selected rows or transferring charges or voltages within the pixel from one node to another.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over one or more paths for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Still referring to FIG. 2, control and processing circuitry 24 may include context switching circuitry 40 (sometimes refer to herein as pixel access control circuitry) that is coupled pixel timing control circuitry 42 in row control circuitry 26. In particular, context switching circuitry 40 may include and/or be coupled to storage circuitry (e.g., registers, storage and processing circuitry 18 in FIG. 1, etc.), on which different pixel access settings (sometimes referred to herein as pixel use contexts, contexts, or pixel access modes) are stored. If desired, context switching circuitry 40 may control pixel timing control circuitry 42 to provide control signals (e.g., reset control signals, pixel charge transfer control signals, row select signals, etc.) associated with different pixel access settings to array 20.

Context switching circuitry 40 may organize how pixels 22 in array 20 are controlled and/or accessed by row control circuitry 26 (e.g., when to send which control signals to which pixels 22 in array 22). As an example, context switching circuitry 40 may control row control circuitry 26 to provide a first set of control signals associated with a first pixel access setting to a first set of pixels 22 and to provide a second set of control signals associated with a second pixel access setting to a second set of pixels 22 at the same time. As another example, context switching circuitry 40 may control the timing of the first set of control signals relative to the second set of control signals using pixel timing control circuitry 42 in row control circuitry 26.

In other words, row control circuitry 26 may begin operating pixels 22 using a first pixel access setting, and context switching circuitry 40 may determine when row control circuitry may begin operating pixels 22 using a second pixel access setting in addition to operating pixels 22 in the first pixel access setting. Context switching circuitry may further determine when row control circuitry 26 may terminate operation using the first pixel access setting and when row control circuitry 26 may restart operation using the first pixel access setting. In particular, pixel timing control circuitry 42 may control booster circuitry associated with different sets (e.g., rows) of pixels 22 to generate control signals that facilitate pixel shutter operations, pixel readout operations, etc.

Sometimes described herein as an example, the first pixel access setting may be used by row control circuitry 26, array 20, column control and readout circuitry 28 to generate one or more image frames of a first type. The second pixel access setting may be used by row control circuitry 26, array 20, column control and readout circuitry 28 to generate one or more image frames of a second type. Image sensor 16 may generate frames of different types in an interweaved manner. As an example, image sensor 16 may generate a first frame of a first type, a second frame of a second type, a third frame of the first type, and a fourth frame of the second type, etc. (e.g., when generating frames in a sequential manner, odd-numbered frames are of a first type, and second-number frames are of a second type). As examples, image sensor 16 may generate any pattern of frames of one or more frames of different types in a suitable manner.

If desired, the first and second of image frames may have one or more different frame properties such as frame pixel resolution, frame color, frame capture time, frame processing effects, number of separate exposures used to generate the frame, etc. As an example, a first frame type may be a full color resolution frame, while a second frame type may be a monochrome frame. As another example, a first frame type may be of a higher resolution than a second frame type. These examples are merely illustrative. If desired, context switching circuitry may integrate more than two access settings (e.g., generate more than two types of frames). If desired, any number of different properties may be present between frames of different types.

By using pixel access control circuitry 40 in control and processing circuitry 24, a single array (e.g., array 20) may be controlled by row control circuitry 26 to generate image frames of different types. More specifically, pixel access control circuitry 40 may generate different timing and/or control signals for row control circuitry 26 to seamlessly integrate multiple pixel access settings when controlling pixels 22 in array 20.

Figure 3:
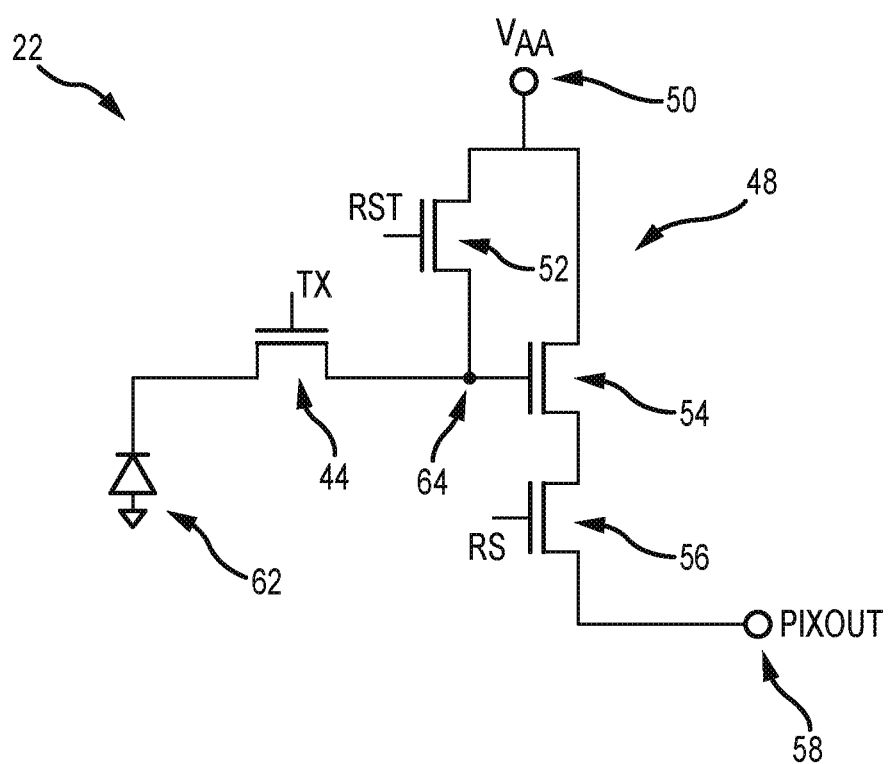
FIG. 3 is a circuit diagram of an illustrative pixel that may be used in a pixel array such as the pixel array shown in FIG. 2 in accordance with some embodiments.

Pixel circuitry 48 in an illustrative image pixel 22 of image sensor 16 is shown in FIG. 3. As shown in FIG. 3, pixel 22 includes a photosensitive element such as photodiode 62. Pixel circuitry 22 may also include components such as transfer transistor 44, reset transistor 52, floating diffusion region 64 (sometimes referred to herein as a floating diffusion node or a charge storage region), source follower transistor 54, row select transistor 56, voltage supply line 50, or pixel output line 58. If desired, charge storage structures such as storage diodes and storage capacitors may also be used to store photodiode charge before readout. A bias voltage (e.g., voltage $V_{AA}$) may be supplied to voltage supply line 50. Charge generation and/or storage structures such as photodiode 62 and floating diffusion region 64 in pixel 22 may be reset to the bias voltage prior to use. As an example, control signals RST and TX may be asserted to reset or shutter photodiode 62 prior to using photodiode 62 to capture incoming light. Incoming light may be collected by photodiode 62 (e.g., after passing through a color filter structure). Photodiode 62 may convert the light to electrical charge.

After acquiring a suitable amount of electrical charge (e.g., after a suitable integrated time period), reset control signal RST may be asserted. This turns on reset transistor 52 and resets floating diffusion node 64 to the bias voltage. The reset control signal RST may then be deasserted to turn off reset transistor 52. After the reset process is complete, transfer gate control signal TX may be asserted to turn on transfer transistor 44. When transfer transistor 44 is turned on, the charge that has been generated by photodiode 62 in response to incoming light is transferred to floating diffusion region 64.

Floating diffusion region 64 may include a region of doped semiconductor (e.g., a doped silicon region formed in a silicon substrate by ion implantation, impurity diffusion, or other doping techniques). Floating diffusion region 64 may include a conductive interconnect region (formed by deposition and etching techniques). The floating diffusion region (i.e. doped semiconductor region and interconnects) exhibits a capacitance that can be used to store the charge that has been transferred from photodiode 62. The signal associated with the stored charge on floating diffusion region 64 is conveyed to row select transistor 56 by source follower transistor 54. In some embodiments, the photodiode charge may be transferred to other charge storage structures, and then transferred to the floating diffusion region 64.

When it is desired to read out the value of the stored charge, row select control signal RS can be asserted. When signal RS is asserted, row select transistor 56 turns on and a corresponding signal PIXOUT that is representative of the magnitude of the charges on floating diffusion node 64 is produced on pixel output line 58. In a typical configuration, there are numerous rows and columns of pixels such as pixel 22 in the image sensor pixel array of a given image sensor. When signal RS is asserted in a given row, pixel output line 58 can be used to route signal PIXOUT from that row to readout circuitry.

Pixel circuitry 48 in FIG. 3 is merely illustrative. If desired, pixels 22 in array 20 in FIG. 2 may have any suitable configuration (e.g., may include additional storage capacitors coupled to a floating diffusion region using additional capacitors, may include additional photosensitive elements, may include additional transistors such as anti-blooming transistors coupled to one or more photosensitive elements, may have storage diodes or storage gates, etc.).

Figure 4A:
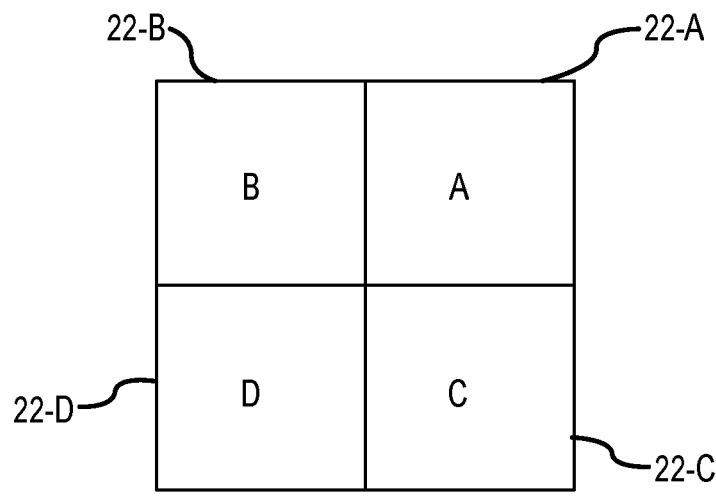
FIG. 4A is a diagram of an illustrative set of pixels that may be accessed to generate image frames of different types in accordance with some embodiments.

FIG. 4A shows an illustrative set of pixels such as a set of pixels 22 in array in FIG. 3. Array 20 may include a set of pixels 22 such as pixels 22-A, 22-B, 22-C, and 22-D (each having circuitry similar to pixel 22 in FIG. 3). As an example, pixels 22-A, 22-B, 22-C, and 22-D may be adjacent pixels such as a set of four pixels that spans two columns and two rows of an array (e.g., in a two-by-two pattern). In particular, pixel 22-A may be covered by a green color filter, pixel 22-B may be covered by a red color filter, pixel 22-C may be covered by a blue color filter, and pixel 22-D may be covered by a green color filter, in a Bayer mosaic pattern. The pattern of the set of pixels 22 in FIG. 4A may be repeated across array 20 in FIG. 2 as an example. Each of pixels 22-A, 22-B, 22-C, and 22-D may generate a respective pixel output (e.g., pixel output A, B, C, and D).

These examples of the type and placement of pixels 22-A, 22-B, 22-C, and 22-D in array 20 are merely illustrative. If desired, pixels 22-A, 22-B, 22-C, and 22-D may be located in the same row, in the same column, or at any desirable locations across array 20. If desired, any type of color filter element may cover each of pixels 22-A, 22-B, 22-C, and 22-D.

Figure 4B:
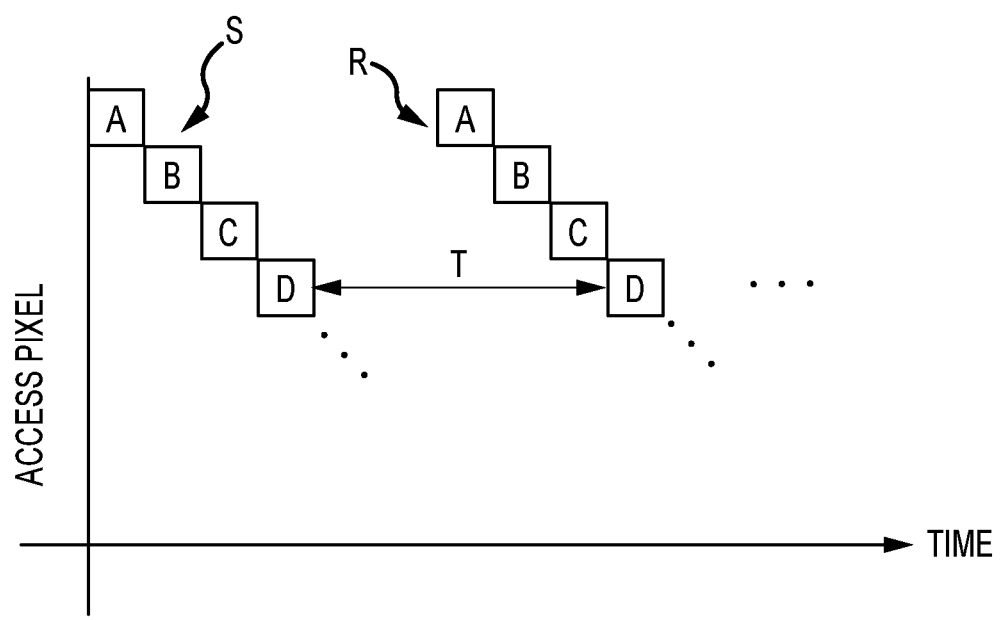
FIGS. 4B and 4C are timing diagrams for accessing a set of pixels such as the set of pixels shown in FIG. 4A in accordance with some embodiments.
Figure 4C:
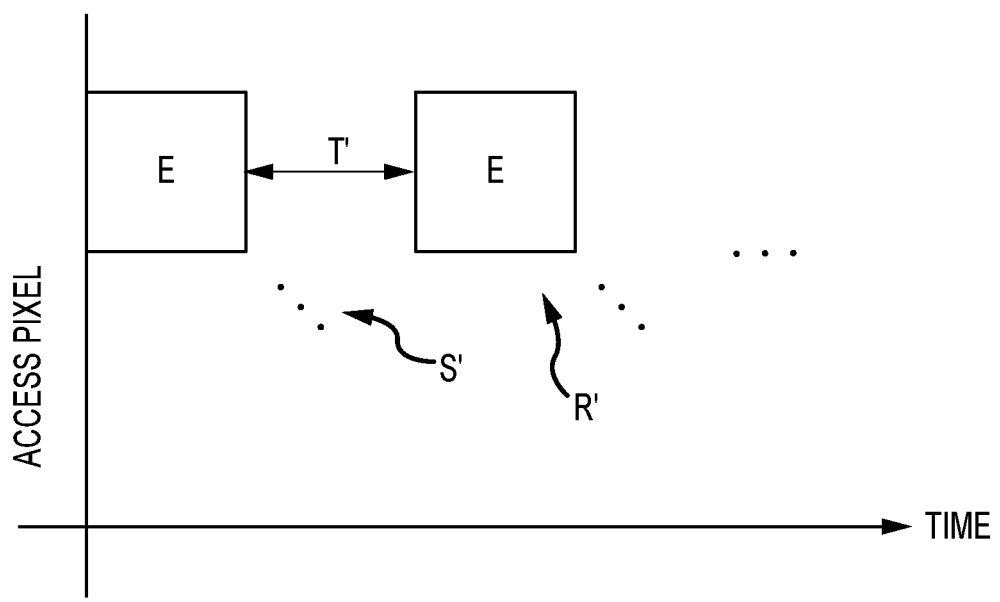

FIGS. 4B and 4C show how a set of pixels such as pixels 22-A, 22-B, 22-C, and 22-D in FIG. 4A may be used to generate image data. In particular, FIG. 4A shows how image data from each of pixels 22-A, 22-B, 22-C, and 22-D may be separately accessed in a sequential manner during both pixel reset or shutter operations S and pixel readout operations R as part of a first pixel access setting. As an example, during pixel shutter operations S, photodiode 62 in pixel 22-A may first be reset using corresponding control signal RST in FIG. 3 and control signal TX in FIG. 3 (sometimes referred to herein as control signal TXA for pixel 22-A) that activate respective transistors 52 and 44 in FIG. 3 for pixel 22-A. Similarly, respective photodiodes in pixels 22-B, 22-C, and 22-D may subsequently be reset in a sequential manner using corresponding control signals RST and control signals TXB, TXC, and TXD. In other words, shutter operations S may occur in a rolling manner (as a rolling shutter) to generate pixel output A, B, C, and D.

The shutter operations described above are merely illustrative. If desired, additional pixels may have photodiodes that are reset before and/or after photodiodes in pixels 22-A, 22-B, 22-C, and 22-D are reset. As described in connection with FIG. 4A, pixels 22-A, 22-B, 22-C, and 22-D may be formed in a two-by-two pattern, spanning two columns and two rows of an array. In this scenario, because control signals may be provided on a per-row basis, shutter operations S may occur simultaneously for pixels 22-A and 22-B, and simultaneously for pixels 22-C and 22-D. The shutter operations of pixels 22-C and 22-D may still be subsequent to those of pixels 22-A and 22-B in a rolling manner.

After a suitable time period (e.g., integration time period T sometimes referred to herein as an exposure time period), readout operations R for pixels 22-A, 22-B, 22-C, and 22-D may occur. As an example, during readout operations R, floating diffusion region 64 in pixel 22-A may be reset using corresponding control signal RST, and subsequently control signal TXA may be asserted to transfer charge accumulated in photodiode 62 for pixel 22-A to floating diffusion region 64 for pixel 22-A. To complete readout operations R, the transferred charge may be read out by readout circuitry in pixel 22-A such as source follower transistor 54 and row select transistor 56 in FIG. 3 and by column circuitry 28, as examples. Similarly, respective floating diffusion regions in pixels 22-B, 22-C, and 22-D may also receive corresponding photodiode-accumulated charge, and respective readout circuitry may read out the transferred charge. Readout operations R may also occur in a rolling manner to generate pixel output A, B, C, and D. In other words, readout operations for one or more pixels may occur after readout operations for other pixels.

The shutter operations described above are merely illustrative. If desired, additional pixels may have accumulated charge that are read out before and/or after accumulated charge in pixels 22-A, 22-B, 22-C, and 22-D are read out. As described in connection with FIG. 4A, pixels 22-A, 22-B, 22-C, and 22-D may be formed in a two-by-two pattern, spanning two columns and two rows of an array. In this scenario, because control signals may be provided on a per-row basis, readout operations R may occur simultaneously for pixels 22-A and 22-B using different column lines, and simultaneously for pixels 22-C and 22-D using the different column lines. The readout operations of pixels 22-C and 22-D may still be subsequent to those of pixels 22-A and 22-B in a rolling manner.

Because the accumulated charge in respective photodiodes 62 in pixels 22-A, 22-B, 22-C, and 22-D are read out separately, different color data can be extracted from each of the pixels and a colorized frame may be generated. FIG. 4C shows an alternative shutter and readout scheme for a set of pixels such as pixels 22-A, 22-B, 22-C, and 22-D in a second pixel access scheme. In particular, in FIG. 4C, shutter operations S' and readout operations R' may occur simultaneously for set of pixels 22-E. Set of pixels 22-E may be the combination of pixels 22-A, 22-B, 22-C, and 22-D, as an example.

In this scenario, pixels 22-A, 22-B, 22-C, and 22-D (e.g., set of pixels 22-E) may be shuttered simultaneously in shutter operations S'. In other words, control signals RST, TXA, TXB, TXC, and TXD may be simultaneously asserted to reset respective photodiodes in pixels 22-A, 22-B, 22-C, and 22-D and begin charge integration simultaneously. After a desirable integration time period (time period T'), readout operations R' may occur to generate combined pixel output E. Combined pixel output E may be generated based on pixel outputs A, B, C, and D (e.g., as a linear combination of one or more of pixel outputs A, B, C, and D). In other word, after resetting respective floating diffusion regions of pixels 22-A, 22-B, 22-C, and 22-D, control signals TXA, TXB, TXC, and TXD may be simultaneously asserted to end integration time period T' and transfer the generated charge into the respective floating diffusion regions of pixels 22-A, 22-B, 22-C, and 22-D. Readout circuitry may separately readout one or more of pixel outputs A, B, C, and D and combine pixel outputs A, B, C, and D to generate combined pixel output E.

As similarly described in connection with FIG. 4B, shutter operations S' and readout operations R' may similarly occur in a rolling manner. As an example, another set of pixels may generate separate pixel outputs that are combined to form the next combined pixel output (as indicted by the ellipses). Additionally, as similarly described in connection with FIG. 4B, because some of pixels 22-A, 22-B, 22-C, and 22-D may be formed in the same row, readout operations may occur simultaneously using different column lines.

Because the accumulated charge in respective photodiodes 62 in pixels 22-A, 22-B, 22-C, and 22-D are combined to form single combined pixel output, monochrome data can be extracted and a monochrome frame (e.g., from multiple such combined pixel outputs such as combined pixel output E and other analogous combined pixel outputs) can be generated.

While only the shutter and readout operations of pixels 22-A, 22-B, 22-C, and 22-D are shown, this is merely illustrative. Other pixels in the same array (array 20 in FIG. 2) may be shuttered and read out in a similar fashion (e.g., as part of the rolling shutter and rolling readout shown in FIGS. 4B and 4C). While operations were described in FIGS. 4B and 4C to occur in a rolling manner, this is merely illustrative. If desired, some or all of shutter operations may be in a global manner (e.g., pixels in an array may be accessed simultaneously). While FIGS. 4B and 4C describe two pixel access settings that may be used by pixel access control circuitry 40 and row control circuitry 26 in FIG. 2, pixel access control circuitry 40 and row control circuitry 26 may also include additional pixel access settings and/or may periodically operate with a single pixel access setting.

FIG. 5 shows how pixel access control circuitry such as pixel access control circuitry 40 in FIG. 2 may be used to generate image frames having different properties using two different pixel access settings such as those described in connection with FIGS. 4B and 4C. In particular, pixel access control circuitry 40 may control an array such as array 20 in FIG. 2 to generate frames F1, F2, and F3. In particular, pixel access control circuitry 40 may generate first frame F1 using readout operations R performed with a pixel access setting such as the pixel access setting described in connection with FIG. 4B. While not shown, shutter operations corresponding to readout operations R for first frame F1 (similar to shutter operations S for third frame F3) may occur before readout operations R. As an example, pixel access control circuitry 40 may generate first frame F1 using shutter operations S and readout operations R as described in connection with the pixel access control setting in FIG. 4B.

In particular, readout operations R occurs across pixels 22 in array 20 in a rolling manner. Before readout operations R finishes across all pixels 22 in array 20, pixel access control circuitry 40 may control array 20 using row control circuitry 26 to perform shutter operations S' for second frame F2. In other words, readout operations R for a later set of pixels may only partially overlap shutter operations S' for an earlier set of pixels. Pixel access control circuitry 40 may control a timing between a start of readout operations R and a start of shutter operations S' to ensure that no concurrent or overlapping usage of the same pixel or set of pixels occurs (e.g., the shutter operations for a current frame does not simultaneously use a pixel that is used in the readout operations R for a previous frame.). Readout operations R' for second frame F2 may occur after integration time T' to read out data for the second frame. As an example, pixel access control circuitry 40 may generate second frame F2 using shutter operations S' and readout operations R' performed with a pixel access control setting such as the pixel access control setting described in connection with FIG. 4C.

Similarly, before readout operations R' finishes across all pixels 22 in array 20, pixel access control circuitry 40 may control array 20 using row control circuitry 26 to perform shutter operations S for third frame F3. Pixel access control circuitry 40 may similarly control a timing between a start of readout operations R' and a start of shutter operations S to ensure no concurrent usage of the same pixel or set of pixels occurs. Readout operations R' for some pixels may otherwise partially overlap shutter operations S for other pixels (e.g., pixel access control circuitry 40 may control row control circuitry 26 to access a first portion of array 20 to perform readout operations R' while accessing a second portion of array 20 to perform shutter operations S). Readout operations R for third frame F3 may occur after integration time T to read out data for the third frame. As an example, pixel access control circuitry 40 may generate third frame F3 using shutter operations S and readout operations R as described in connection with the pixel access control setting in FIG. 4B. If desired, pixel access control circuitry 40 may generate third frame F3 using a third different pixel access setting, thereby generating a frame of a different type than those of first and second frames F1 and F2.

Figure 6:
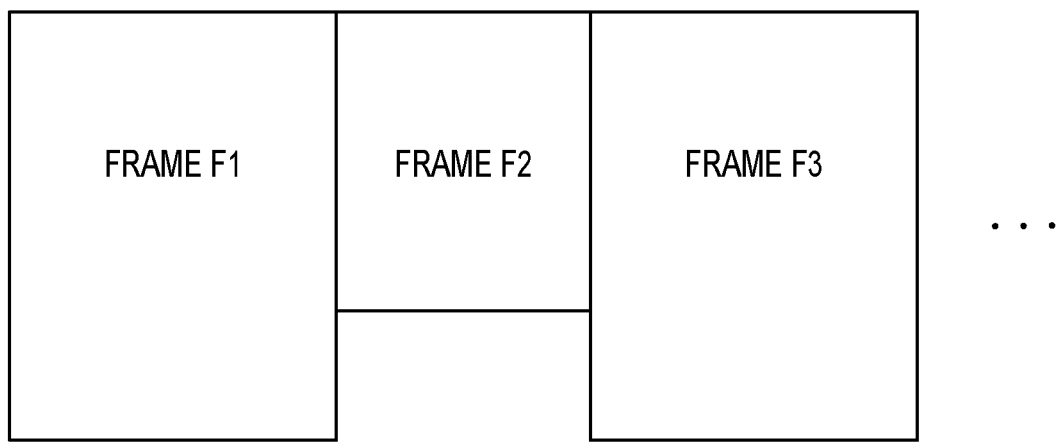
FIG. 6 is a diagram of illustrative image frames that may be generated using different pixel access settings in accordance with some embodiments.

FIG. 6 shows how frame F1 may be different from frame F2 but may be the same as frame F3. As an example, frames F1 and F3 may be of the same pixel resolution and may be a full color frame, whereas frame F2 may be of a lower pixel resolution compared to frames F1 and F3 and may be a monochrome frame. FIG. 6 also illustrates that pixel access control circuitry 40 in FIG. 2 may generate consecutive frames of different types. In particular, this is done without wasting any image pixel data between generating useful frame data for the consecutive frames F1-F3.

Figure 7:
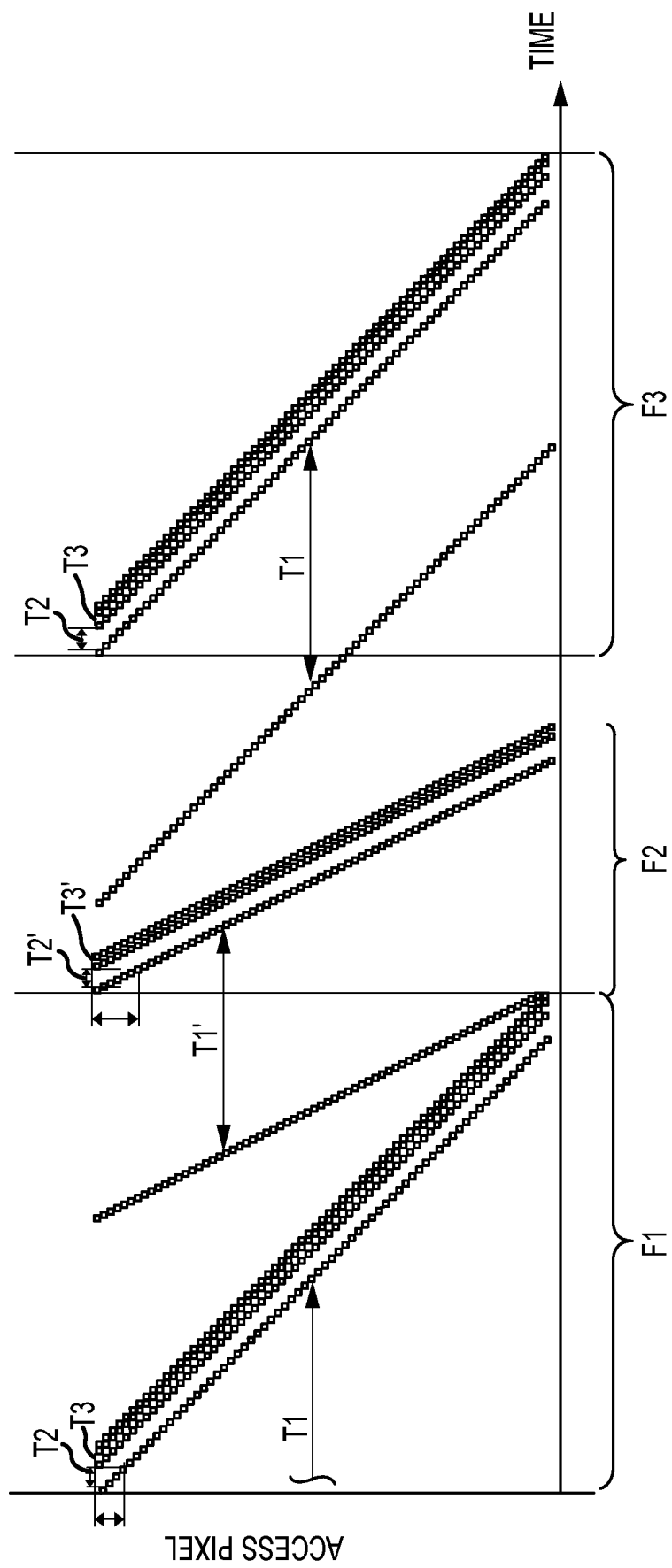
FIG. 7 is a timing diagram for operating an image sensor to generate multi-exposure image frames of different types in accordance with some embodiments.

Additionally, while FIG. 5 shows how a single exposure period (e.g., a single continuous integration time period) may be used to generate each frame, FIG. 7 shows how pixel access control circuitry 40 may control array 20 to generate each frame using pixel output data from multiple exposure periods. In particular, as shown in FIG. 7, three separate integration time periods may be used to generate three corresponding sets of image data. In other words, each of the three exposure time periods (e.g., integration time periods) may have corresponding shutter and read operations. The three exposure time periods may have different lengths. As examples, exposure time period T1 may be the longest, exposure time period T2 may be the second longest, and exposure time period T3 may be the shortest. The three sets of image data may be used to generate a single frame by selecting portions of each set of image data to use in generating the final single frame.

The example of FIG. 7 is merely illustrative. If desired, any number of exposure time periods (e.g., one exposure time period, two exposure time periods, four or more exposure time periods) may be used to generate the corresponding sets of pixel data for each image frame. If desired, different frames may be generated using different numbers of exposure times.

Because, at any given time, row control circuitry 26 and booster circuitry in row control circuitry 26 may provide a varying number of control signals to pixels 22 in array 20 to selectively and simultaneously access different pixels 22 using different pixel accessing settings, particular care should be taken to balance the load of row control circuitry 26 (e.g., pixel circuitry that receives control signals from row control circuitry 26). As an example, referring back to FIG. 5, at a first given time, row control circuitry 26 may only provide control signals associated with readout operations for frame F1. At a second given time, row control circuitry 26 may provide control signals associated with readout operations for frame F1 to a later set of pixels, while row control circuitry 26 provides control signals associated with shutter operations for frame F2 to an earlier set of pixels. At a third given time, row control circuitry 26 may only provide control signals associated with shutter operations for frame F2. At a fourth given time, row control circuitry 26 may only provide control signals associated with readout operations for frame F2. At a fifth given time, row control circuitry 26 may provide control signals associated with readout operations for frame F4 to a later set of pixels, while row control circuitry 26 provides control signals associated with shutter operations for frame F3 to an earlier set of pixels. The load balance for row control circuitry 26 may be even more problematic in the scenarios in which frame F2 uses the monochrome pixel access setting, which includes four simultaneous transfer control signals whereas, frames F1 and F3 use the full color resolution pixel access setting, which includes separate transfer control signals.

Figure 8:
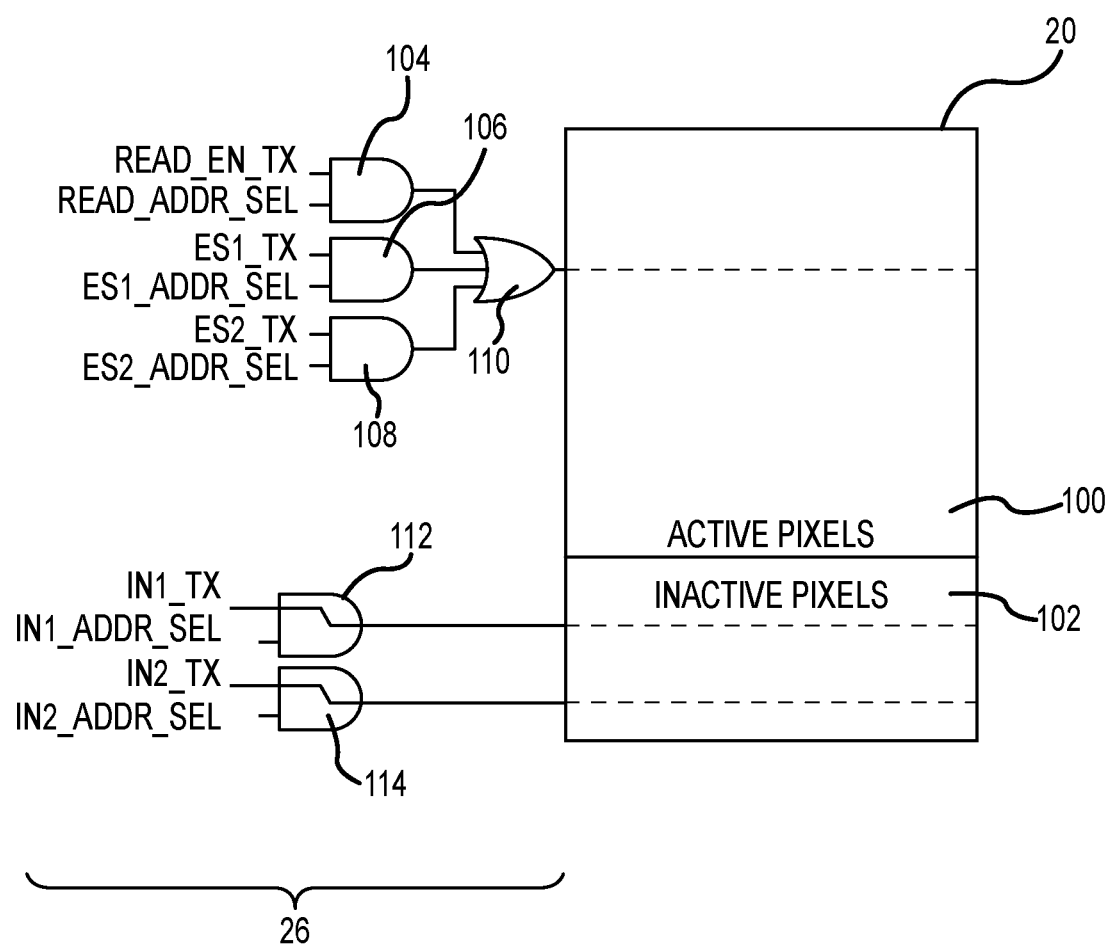
FIG. 8 is a diagram of illustrative pixel access circuitry coupled to active pixels and inactive pixels in accordance with some embodiments.

To mitigate these issues and further improve the use of multiple pixel access settings, array 20 may have inactive pixels such as inactive pixels 102 (sometimes referred to herein as dummy pixels or park pixels) arranged in rows of array 20, in addition to active pixels such as active pixels 100 arranged in rows of array 20 in FIG. 8. In particular, row control circuitry 26 may include a network of logic gates through which control signals are provided to pixels 22 in array 20. Control signals READ_EN_TX and READ_ADDR_SEL may be used for readout operations associated with any pixel access setting and are provided as inputs to logic AND gate 104. Control signals ES1_TX and ES1_ADDR_SEL may be used for a first set of shutter operations associated with a first pixel access setting and are provided as inputs to logic AND gate 106. Control signals ES2_TX and EX2_ADDR_SEL may be used for a second set of shutter operations associated with an additional pixel access setting and are provided as inputs to logic AND gate 108. If desired, additional control signals may be used for additional sets of shutter operations and/or readout operations for other additional pixel access settings.

As an example, control signals ADDR_SEL (e.g., READ_ADDR_SEL, ES1_ADDR_SEL, ES2_ADDR_SEL) may be an enable signal that enables a corresponding operation when asserted. Control signals TX (e.g., READ_EN_TX, ES1_TX, and ES2_TX) may correspond to enabling a specific transistor such as transistor 44 in FIG. 3 to perform the corresponding operations.

The outputs of logic AND gates 104, 106, and 108 may be provided as inputs to logic OR gate 110. The output of logic OR gate 110 may be used to control charge transfer transistors such as charge transfer transistor 44 in FIG. 3. In other words, the output of logic OR gate may be or be used to generate control signal TX for pixels across a row of pixels 22 in array 20. If desired, circuitry analogous to logic gates 104, 106, 108, and 110 may be provided for and coupled to each row (or any other portion) of active pixels 100 in array 20. Logic gates 104, 106, 108, and 110 may be collectively referred to herein as pixel access circuitry for active pixels. If desired, circuitry analogous to logic gates 104, 106, 108, and 110 may be provided for and coupled to every two rows of active pixels 100 such that two rows of pixel may be controlled.

As an example, when control signals READ_EN_TX and READ_ADDR_SEL are at logic highs (i.e., at a logic '1'), one or more transfer transistors in a row of active pixels 100 may be activated to transfer photodiode-accumulated charge for readout operations. As another example, when control signals ES1_TX and ES1_ADDR_SEL are at logic highs, the one or more transfer transistors (in combination with other transistors) in a row of active pixels 100 may be activated to reset one or more photodiodes in the row of active pixels 100 for shutter operations associated with a first pixel access setting. As another example, when control signals ES2_TX and ES2_ADDR_SEL are at logic highs, the one or more transfer transistors (in combination with other transistors) in a row of active pixels 100 may be activated to reset one or more photodiodes in the row of active pixels 100 for shutter operations associated with a second pixel access setting.

Additionally, a first set of inactive pixels 102 (e.g., a first row of inactive pixels 102) in array 20 may be coupled to logic AND gate 112. Logic AND gate 112 may receive as inputs control signals IN1_TX and IN1_ADDR_SEL. If desired, IN1_TX may be directly provided to the first set of inactive pixels 102 (e.g., without accounting for the state of control signal IN1_ADDR_SEL). In particular, IN1_TX may mirror the active states of control signals (e.g., signals ES1_TX) received by active pixels 100 when the states of these control signals are in fact inactive.

Similarly, a second set of inactive pixels 102 (e.g., a second row of inactive pixels 102) in array 20 may be coupled to logic AND gate 114. Logic AND gate 114 may receive as inputs control signals IN2_TX and IN2_ADDR_SEL. If desired, IN2_TX may be directly provided to the second set of inactive pixels 102. In particular, IN2_TX may mirror the active states of control signals (e.g., signals ES2_TX) received by active pixels 100 when the states of these control signals are in fact inactive. Logic gates 112 and 114 may be collectively referred to herein as pixel access circuitry for inactive pixels.

By generating control signals for both active and inactive pixels, booster circuit load and row control circuitry may be maintained at a constant. In other words, any asserted pixel access control signal may be always provided to pixels 22 in array 20, whether it is provided to active pixels 100 (e.g., through logic gates 104, 106, 108, and 110) or inactive pixels 102 (e.g., through logic gates 112 and 114).

Figure 9A:
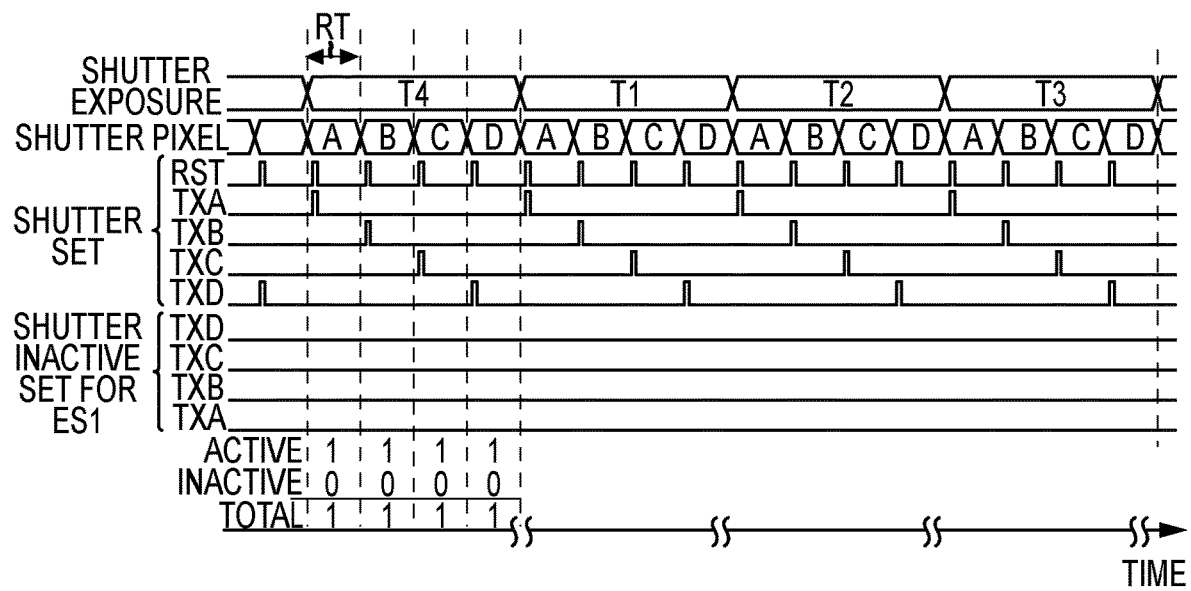
FIGS. 9A-9C are timing diagrams for separately performing shutter and read operations for a set of pixels in a pixel access setting in accordance with some embodiments.
Figure 9B:
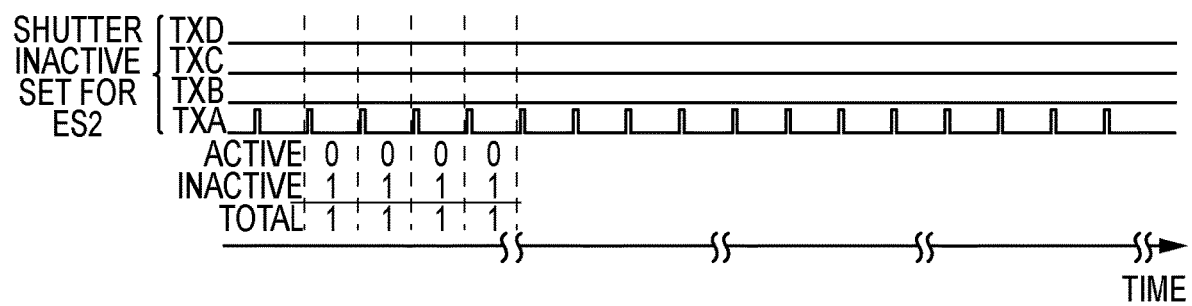
Figure 9C:
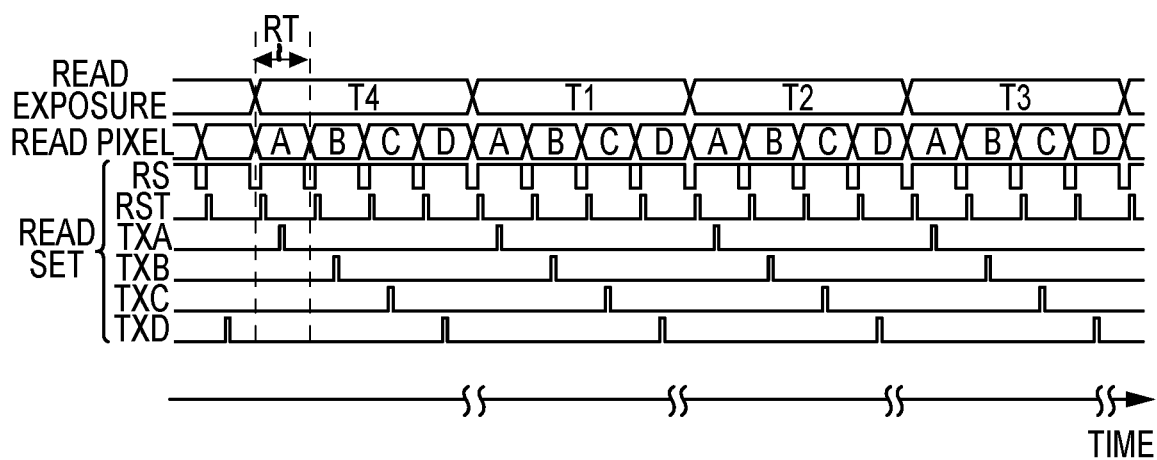

FIGS. 9A-9C further illustrate this point for a given pixel access setting. In the exemplary timing diagram shown in FIG. 9A, a pixel access setting similar to that of FIG. 4B is shown. In particular, a frame generated using the pixel access setting may be generated based on four exposure time periods T1, T2, T3, and T4. During each row time RT of each exposure time period, pixels 22 such as pixels 22-A, 22-B, 22-C, and 22-D may be separately shuttered (e.g., reset using a combination of control signals RST and TX, using control signals ES1_TX and ES1_ADDR_SEL in FIG. 8, using control signals ES2_TX and ES2_ADDR_SEL in FIG. 8). These pixels may be active pixels 100 in array (referred to as 'shutter set'). Because active pixels may actively use these asserted control signals RST and TX, there may be no need for inactive pixels 102 to receive any control signals (e.g., during period ES1). As such, there may be no signal assertions for 'shutter inactive set' corresponding to inactive pixels 102. In other words, control signals IN1_TX and/or IN2_TX may be deasserted or at a logic low (i.e., at logic '0').

As shown in the chart in FIG. 9A, during each row time RT, the total number of TX assertions are maintained at one, as an example. In particular, during period ES1, active pixels 100 may have one assertion per row time RT, while inactive pixels 102 may have no assertions per row time RT.

FIG. 9B shows operation of inactive pixels 102 for period ES2, during which pixels 22-A, 22-B, 22-C, and 22-D may not be actively shuttered as described in shown with FIG. 9A. In particular, to maintain a balance of load for row control circuitry 26 in FIG. 2, row control circuitry 26 may send control signals such as TXA in FIG. 9B to inactive pixels 102 and more particular, to a given inactive pixel that receives the analogous control signal. As shown in the chart in FIG. 9B, during each row time, the total number of assertions are still maintained at one, as an example. In particular, the lack of asserted signals received by active pixels 100 in this pixel access setting is balanced by the asserted signals received by inactive pixels 102 or more specifically a particular dummy pixel in the example of FIG. 9B. If desired, any number of dummy pixels may be used to maintain the total number of assertions during each row time RT at one.

FIG. 9C shows a timing diagram for reading out the generated image data for each of the four exposure time periods T1, T2, T3, and T4. In particular, during each row time RT, a given one of active pixels may be read out. If desired, a reset signal may be asserted prior to asserting the charge transfer signal that transfers an image signal to be read out.

While FIGS. 9A-9C shows four exposure time periods and four pixels each having a separate row time RT, this is merely illustrative. If desired, any number of exposure time periods may take place of any length of time (e.g., one or more of each of the exposure time period may have different lengths of time). If desired, additional pixels may be shuttered and the corresponding image data may read out for each exposure time period. While pixels 22-A, 22-B, 22-C, and 22-D are grouped as a set, this is merely illustrative. If desired, any number of pixels may be grouped. If desired, a shutter set may be a shutter row in which an entire row is shutter and read out in a rolling manner.

Figure 10A:
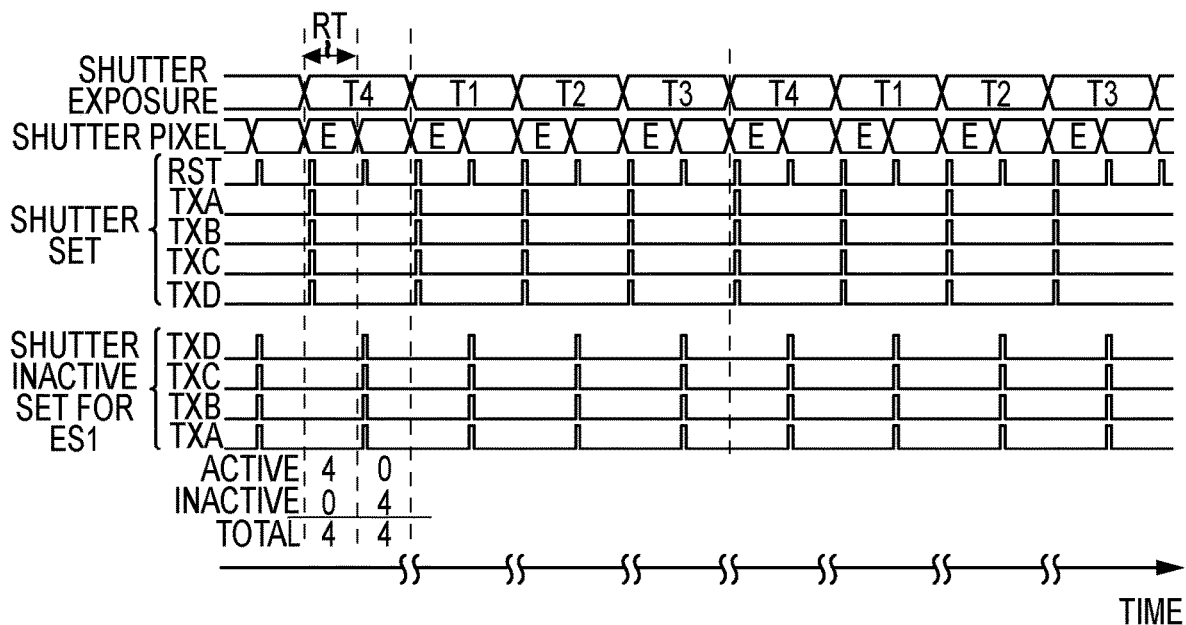
FIGS. 10A-10C are timing diagrams for integrally performing shutter and read operations for a set of pixels in a pixel access setting in accordance with some embodiments.

In the exemplary timing diagram shown in FIG. 10A, a pixel access setting similar to that of FIG. 4C is shown. In particular, a frame generated using the pixel access setting may be generated based on four exposure time periods T1, T2, T3, and T4. During a first row time RT of each exposure time period, a set of pixels 22 (referenced as set of pixels E or 22-E in FIG. 10C) such as pixels 22-A, 22-B, 22-C, and 22-D may be synchronously shuttered (e.g., reset using a combination of control signals RST and TX, using control signals ES1_TX and ES1_ADDR_SEL in FIG. 8, using control signals ES2_TX and ES2_ADDR_SEL in FIG. 8). These pixels may be the same active pixels 100 in array 20 referred to in FIG. 9A at different times during operation, as an example. Because active pixels may actively use these asserted control signals RST and TX in the first row time RT, there may be no need for inactive pixels 102 to receive any control signals during the first row time RT (e.g., for period ES1). As such, there may be no signal assertions for 'shutter inactive set' corresponding to inactive pixels 102 in the first row time RT. In other words, control signals IN1_TX and/or IN2_TX may be deasserted or at a logic low.

In contrast, during a second row time RT, none of the four pixels 22-A, 22-B, 22-C, and 22-B may be shuttered. In order to balance the load of row control circuitry 26, control signals IN1_TX and/or IN2_Tx may be asserted or at a logic high. As shown in the chart in FIG. 10A, during each row time RT, the total number of TX assertions are maintained at four, as an example. In particular, during the first row time RT for period ES1, active pixels 100 may have four assertions, while inactive pixels 102 may have no assertions for that row time RT. During the second row time RT for period ES1, active pixels 100 may have no assertions, while inactive pixels 102 may have four assertions for that row time RT.

Figure 10B:
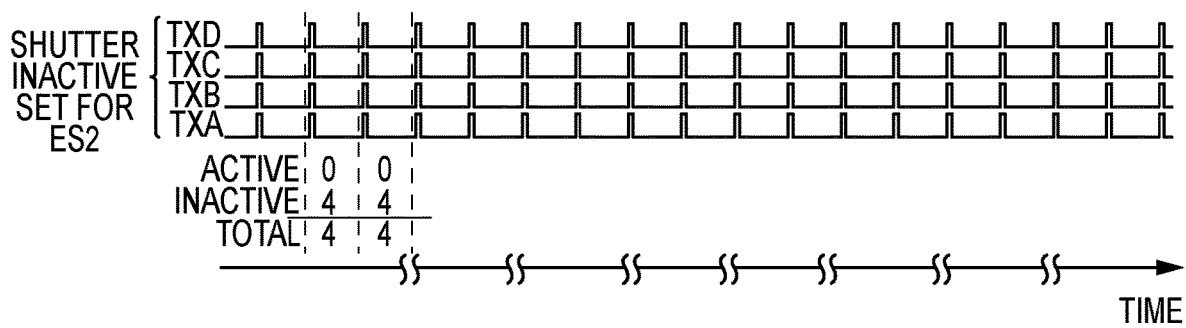

FIG. 10B shows operation of inactive pixels 102 for period ES2, during which pixels 22-A, 22-B, 22-C, and 22-D may not be actively shuttered as described in connection with FIG. 9A. In particular, to maintain a balance of load for row control circuitry 26 in FIG. 2, row control circuitry 26 may send control signals such as TXA, TXB, TXC, and TXD in FIG. 10B to inactive pixels 102 and more particular, to inactive pixels analogous to pixels 22-A, 22-B, 22-C, and 22-D. As shown in the chart in FIG. 10B, during each row time, the total number of assertions are still maintained at four, as an example. In particular, the lack of asserted signals received by active pixels 100 in this pixel access setting is balanced by the asserted signals received by inactive pixels 102 or more specifically respective dummy pixels in the example of FIG. 10B. If desired, any number of dummy pixels may be used to maintain the total number of assertions during each row time RT at four.

Figure 10C:
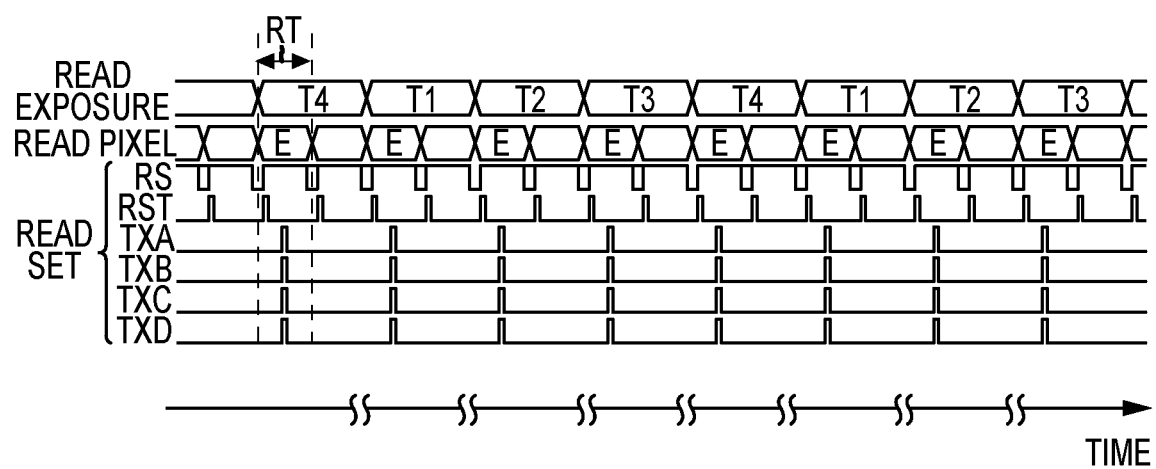

FIG. 10C shows a timing diagram for reading out the generated image data for each of the four exposure time periods T1, T2, T3, and T4. In particular, during a first row time RT of each exposure time period, accumulated charge for pixels 22-A, 22-B, 22-C, and 22-D may be synchronously transferred and subsequently read out. If desired, a reset signal may be asserted prior to asserting the charge transfer signal that transfers an image signal to be read out.

While FIGS. 10A-10C shows four exposure time periods and four pixels each having a separate row time RT, this is merely illustrative. If desired, any number of exposure time periods may take place of any length of time (e.g., one or more of each of the exposure time period may have different lengths of time). If desired, additional pixels may be shuttered and the corresponding image data may read out for each exposure time period. While pixels 22-A, 22-B, 22-C, and 22-D are grouped as a set, this is merely illustrative. If desired, any number of pixels may be grouped. If desired, a shutter set may be a shutter row in which an entire row is shutter and read out in a rolling manner.

Because different portions of array 20 may be accessed using different pixel access operations at the same time, multiple sets or rows of inactive pixels 102 may be concurrently used to balance the load of row control circuitry 26. As an example, a first row of inactive pixels 102 may be used for the operations described in FIGS. 9A-9C and a second row of inactive pixels 102 may be used for the operations described in FIGS. 10A-10C.

Figure 11:
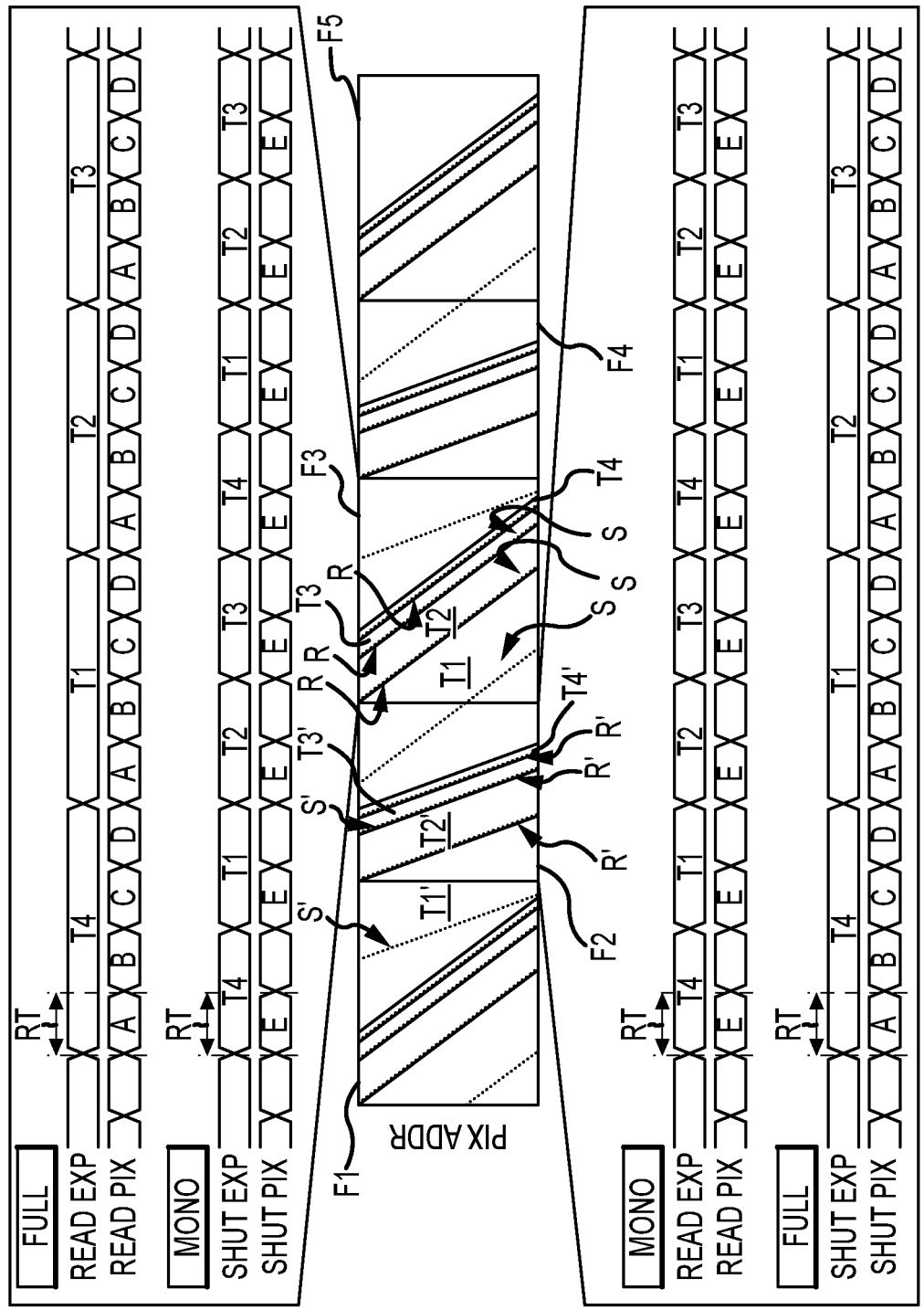
FIG. 11 is a diagram of illustrative frames generated by simultaneously performing different types pixel access settings such as those shown in FIGS. 9A-9C and 10A-10C across an array in accordance with some embodiments.

FIG. 11 shows how the shutter and readout operations for the two different pixel access settings as described in connection with FIGS. 9A-9C and 10A-10C may be combined. In particular, context switching circuitry or pixel access control circuitry 40 in FIG. 2 may provide control signals to maintain and update separate read and shutter pointers for each pixel access setting. These read and shutter points may be updated using pixel timing control circuitry 42 in FIG. 2, if desired.

As an example, a separate shutter pointer may be initialized to begin shutter operations S' for integration time period T1' of frame F2. This shutter pointer may be updated to shutter pixels across an array (e.g., based on pixel or pixel row addresses) and may be updated independently from other shutter pointers (e.g., shutter pointers for other pixel access settings). Because the corresponding readout pointer (e.g., for readout operations R' for integration time period T1' of frame F2) may be based on this shutter pointer, the corresponding readout pointer may be initialized after the desirable integration time period T1.

The shutter pointer for integration time period T1' of frame F2 may begin the use of a different pixel access setting than the previous pixel access setting used to generate previous frames. As such, pixel access control circuitry 40 may initialize a portion of access registers associated with the shutter pointer of the different pixel access setting. After the previous pixel access setting is completely terminated (e.g., no pixels are accessed using the previous pixel access setting), a remaining portion of access registers associated with the different pixel access setting (e.g., for shutter and read operations of frame F2) may be initialized.

Similarly, a shutter pointer for frame F3 may be initialized (using a portion of access registers) while some pixels are still accessed using the pixel access setting for frame F2. After the pixel access setting for frame F2 has completed, a remaining portion of access registers may be used to provide shutter and readout operations for frame F3.

The examples provided in FIGS. 4-11 are merely illustrative. If desired, pixel access control circuitry 40 in FIG. 2 may generate different image frames using different pixel array access and processing settings with the same image pixel array in an image sensor. As examples, pixel array access settings may include shutter and read sequence settings, image color settings, frame rate settings, exposure time settings, integration time settings, pixel array window settings, pixel data processing settings, pixel data summing or averaging settings, etc. If desired, any suitable settings associated with the capturing, processing, and storing of image data may be adjusted across different image frames.

In particular, it may be desirable to capture successive image frames using alternating pixel array access settings. The successive frames may be generated at different frame rates with different color schemes using the same image sensor pixel array. As an example, a first frame may be generated at 30 frames per second (i.e., data for a single frame may be read in 33.33 milliseconds). The first frame may be an eight-megapixel full resolution frame generated using four separate integration times (e.g., integration times T1, T2, T3, and T4). If desired, integration time T1 may be larger than integration time T2, integration time T2 may be larger than integration time T3, integration time T3 may be larger than integration time T4. Each integration may generate a corresponding image signal that is then stored. The shutter and read operations may be performed in a row-wise manner.

A second succeeding frame may be a frame generated using a pixel access setting that is different from the setting used to generate the first frame (e.g., a two-megapixel monochrome frame generated at 45 frames per second (i.e., data for a single frame may be read in 22.22 milliseconds). The shutter operation for the second frame may at least temporally overlap a portion of the shutter and read operations of the first frame. As an example, the shutter operation of the second frame may be begin at pixel row one in an array, while the read and shutter operations of the first frame is still occurring at subsequent pixel row in the array (e.g., a pixel row in the middle of the pixel array). The second frame may similarly be generated using four separate integration times, the first of which may be the longest of the four integration times. As an example, the shutter operation of the second frame may begin with collecting image signals for the first integration time T1 of the second frame. Subsequent to the completion of the shutter and read operations of integration time T4 for the first frame, the read operation for the integration time T1 of the second frame may begin.

A third frame may be a frame generated using a pixel access setting that is generated at 30 frames per second (i.e., data for a single frame may be read in 33.33 milliseconds). As an example, the third frame may be generated using the same pixel access settings as the first frame. However, if desired, any other pixel access settings may be used to generate the third frame. As an example, the third frame may also include four separate integration times T1-T4. The shutter operation of the first integration time T1 of the third frame may begin prior to the ending of the shutter and read operation for the second frame. The read operation of the data collected at integration time T1 may occur after the read operation of the last integration time period for the second frame.

In such a way, an image sensor can form frames generated using different pixel access settings. These differently generated frames may be efficiently interweaved within each other, such that no invalid data is output from the frames. In other words, the image sensor may generate image data in a time efficient manner (e.g., by temporally overlapping the shutter and read operation of adjacent frames).

In particular, an image sensor may include context switching circuitry formed on control circuitry and/or processing circuitry. The image sensor may include an image pixel array formed on a first die or substrate. The context switching circuitry may be formed on the first die. If desired, the control switching circuitry may be formed on a second separate die that is coupled to the first die in a stacked configuration or in any other suitable configuration.

The context switching circuitry may provide control signals to the pixel array to selectively control shutter and read operations for generating different frames. The context switching circuitry may include registers, control paths coupling the image sensor array to the registers, processing circuits, storage circuits, etc. Successive frames generated using different settings may be interweaved between one another. As an example, eight-megapixel full resolution frames and two-megapixel monochrome frames may be alternatingly generated by the pixel array. A first context A (sometimes referred to herein as a pixel access setting or pixel access mode) may be associated with generating and outputting a first frame type, and a second context B may be associated with generating and output a second frame type.

Context switching circuitry may use context A to control the array to perform shutter and read operations for the first frame. The context switching circuitry may then provide a first set of control signals associated with context B to begin only the shutter operation for the integration time T1 of the second frame (e.g., partially update the control scheme of the array). The context switching circuitry may continue to supply control signals associated with context A to portions of the array to continue generating the first frame. Once the first frame is completely generated, the context switching circuitry may provide a second set of control signals associated with context B to completely update the control scheme of the array.

Similarly, the context switching circuitry may partially switch back to context A when beginning to generate the third frame. The context switching circuitry may control the array to begin performing shutter operations (e.g., shutter operation of the first integration time) for the third frame by switching the context (e.g., settings) of circuitry that control shutter operations into context A. The context switching circuitry may subsequently switch the context of any suitable remaining circuitry into context A.

Various embodiments have been described illustrating systems and methods for generating image frames having different properties using pixel access control circuitry.

An image sensor may include an array of image pixels having active and inactive pixels. Row control circuitry may be coupled to the active pixels using a first set of row control paths and the inactive pixels using a second set of row control paths. Pixel access control circuitry may be configured to control the row control circuitry. In particular, pixel access control circuitry may control a first portion of the active pixels such as a first pixel to generate image data used for generating a first image frame based on a first pixel access mode (e.g., a pixel access setting, a context). Pixel access control circuitry may control a second portion of the active pixels such as a second pixel to generate image data used for generating a second image frame based on a second pixel access mode. If desired, pixel access control circuitry may control the active pixels to generate a third image frame.

The first and third image frames may have the same frame properties. The first and second image frames may have at least one different frame property such as a different color resolution (e.g., a colorized frame versus a monochrome frame), a different pixel resolution (e.g., a higher pixel resolution versus a lower pixel resolution). If desired, the first, second, and third image frames may each be generated using multiple separate exposure times.

The row control circuitry may be configured to assert at least a first control signal received by the first pixel to perform shutter operations based on the first pixel access mode while the row control circuitry asserts at least a second control signal received by the second pixel to perform readout operations based on the second pixel access mode. The row control circuitry may be configured to assert at least the first control signal after an integration time period. The row control circuitry may be configured to assert at least the second control signal to perform shutter operations during the integration time period. In other words, shutter operations associated with one pixel access mode may temporally overlap readout operations of another pixel access mode.

The row control circuitry may be configured to perform shuttering operations on the first portion of the active pixels based on the first pixel access setting during a first time period and may be configured to perform shuttering operations on a first portion of the inactive pixels based on the first pixel access setting during a second time period. The row control circuitry may be configured to perform shuttering operations on the second portion of the active pixels based on the second pixel access setting during a third time period and may be configured to perform shuttering operations on a second portion of the inactive pixels based on the second pixel access setting during a fourth time period. The first and second time periods may be temporally nonoverlapping and the third and fourth time periods may be nonoverlapping.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an array of image pixels;
   row control circuitry coupled to the array of image pixels; and
   pixel access control circuitry configured to control the row control circuitry to provide a first control signal to a first pixel in the array of image pixels based on a first pixel access mode and to provide a second control signal to a second pixel in the array of image pixels based on a second pixel access mode, wherein the row control circuitry is configured to assert the first control signal received by the first pixel to perform a shutter operation based on the first pixel access mode during a given time period, and the row control circuitry is configured to assert the second control signal received by the second pixel to perform a readout operation based on the second pixel access mode during the given time period.

2. The image sensor defined in claim 1, wherein the first pixel is configured to generate a first image frame using the first pixel access mode and the second pixel is configured to generate a second image frame using the second pixel access mode, and wherein the second image frame has a different frame property than the first image frame.

3. The image sensor defined in claim 2, wherein the row control circuitry is configured to assert the first control signal before an integration time period.

4. The image sensor defined in claim 3, wherein the row control circuitry is configured to assert the second control signal after an additional integration time period different than the integration time period.

5. The image sensor defined in claim 2, wherein the first image frame is generated based on at least two exposure time periods and wherein the second image frame is generated based on at least two exposure time periods.

6. The image sensor defined in claim 2, wherein the first image frame is generated as a colorized image frame and the second image frame is generated as a monochrome image frame.

7. The image sensor defined in claim 2, wherein the first image frame has a first resolution and the second image frame has a second resolution that is different from the first resolution.

8. An image sensor, comprising:
an array of image pixels;
row control circuitry coupled to the array of image pixels; and
context switching circuitry coupled to the row control circuitry, wherein the context switching circuitry controls the array of image pixels to generate first, second, and third consecutive image frames using the row control circuitry, the first and second image frames having at least one differing frame property, wherein the context switching circuitry is configured to provide control signals associated with a context to the row control circuitry, and wherein the row control circuitry is configured to control the array to generate the first and third image frames using a shutter operation and a readout operation based on the context.

9. The image sensor defined in claim 8, wherein the first and third image frames have the same frame properties.

10. The image sensor defined in claim 9, wherein the at least one differing frame property comprises a pixel resolution.

11. The image sensor defined in claim 10, wherein the at least one differing frame property further comprises a color resolution.

12. The image sensor defined in claim 8, wherein the context switching circuitry is configured to provide additional control signals associated with an additional context to the row control circuitry and wherein the row control circuitry is configured to control the array to generate the second image frame using an additional shutter operation and an additional readout operation based on the additional context.

13. The image sensor defined in claim 12, wherein the row control circuitry is configured to control a first portion of the array to perform the shutter operation based on the context while controlling a second portion of the array to perform the additional readout operation based on the additional context.

14. The image sensor defined in claim 13, wherein the row control circuitry is configured to control the first portion of the array to perform the additional shutter operation based on the additional context while controlling the second portion of the array to perform the readout operation based on the context.

15. An image sensor, comprising:
an array of image pixels having a plurality of active pixels arranged in a first set of rows and a plurality of inactive pixels arranged in a second set of rows, the plurality of active pixels comprising a given active pixel;
row control circuitry coupled to the first set of rows and the second set of rows; and
context switching circuitry coupled to the row control circuitry, wherein the context switching circuitry controls the row control circuitry to access the given active pixel using a first pixel access setting during a first time period and to access the given active pixel using a second pixel access setting during a second time period.

16. The image sensor defined in claim 15, wherein the row control circuitry is configured to perform a first shuttering operation on the given active pixel based on the first pixel access setting during the first time period and is configured to perform a second shuttering operation on a given inactive pixel in the plurality of inactive pixels based on the first pixel access setting during a third time period.

17. The image sensor defined in claim 16, wherein the row control circuitry is configured to perform a third shuttering operation on the given active pixel based on the second pixel access setting during the second time period and is configured to perform fourth shuttering operation on the given inactive pixel based on the second pixel access setting during a fourth time period.

18. The image sensor defined in claim 17, wherein the first and second time periods are nonoverlapping and wherein the third and fourth time periods are nonoverlapping.

19. The image sensor defined in claim 15, wherein the plurality of active pixels comprises an additional active pixel and wherein the context switching circuitry controls the row control circuitry to access the additional active pixel using the second pixel access setting during the first time period.

* * * * *